US007700884B2

(12) United States Patent  
Casasnovas et al.

(10) Patent No.: US 7,700,884 B2  
(45) Date of Patent: Apr. 20, 2010

(54) COLUMN GRID ARRAY USING COMPLIANT CORE

(75) Inventors: Anthony Casasnovas, Palm Harbor, FL (US); Scott P. Dukes, St. Petersburg, FL (US)

(73) Assignee: Honeywell International Inc., Morristown, NJ (US)

( * ) Notice: Subject to any disclaimer, the term of this patent is extended or adjusted under 35 U.S.C. 154(b) by 571 days.

(21) Appl. No.: 11/292,694

(22) Filed: Dec. 2, 2005

(65) Prior Publication Data

US 2007/0125571 A1    Jun. 7, 2007

(51) Int. Cl.  
*H05K 1/16* (2006.01)  
*H01R 43/00* (2006.01)

(52) U.S. Cl. .............................. 174/260; 29/739; 29/884

(58) Field of Classification Search .................. 174/260; 361/760, 767–776; 29/884, 739  
See application file for complete search history.

(56) References Cited

U.S. PATENT DOCUMENTS 4,914,814 A    4/1990  Behun et al.

| | | | |
|---|---|---|---|
| 6,337,445 B1* | 1/2002 | Abbott et al. | 174/260 |
| 7,523,852 B2* | 4/2009 | Buchwalter et al. | 228/246 |
| 2008/0081107 A1* | 4/2008 | Tiberi et al. | 427/162 |

FOREIGN PATENT DOCUMENTS

WO        96/09982        1/1997

OTHER PUBLICATIONS

E.I. du Pont de Nemours and Company, Technical Information: DuPont(tm) Kapton E, Oct. 2003.*

* cited by examiner

*Primary Examiner*—Jeremy C Norris  
(74) *Attorney, Agent, or Firm*—Shumaker & Sieffert, P.A.

(57)    ABSTRACT

A method for forming interconnections within a column grid array is provided. The method involves casting one or more columns with at least a compliant core material that increases flexibility between an electronic component and a printed wiring board by at least a factor of two over metallic-based solder columns, and forming the one or more columns to length for interconnecting between the electronic component and the printed wiring board. The method also involves forming a conductive material for the one or more columns to provide electrical interconnection between the electronic component and the printed wiring board.

19 Claims, 7 Drawing Sheets

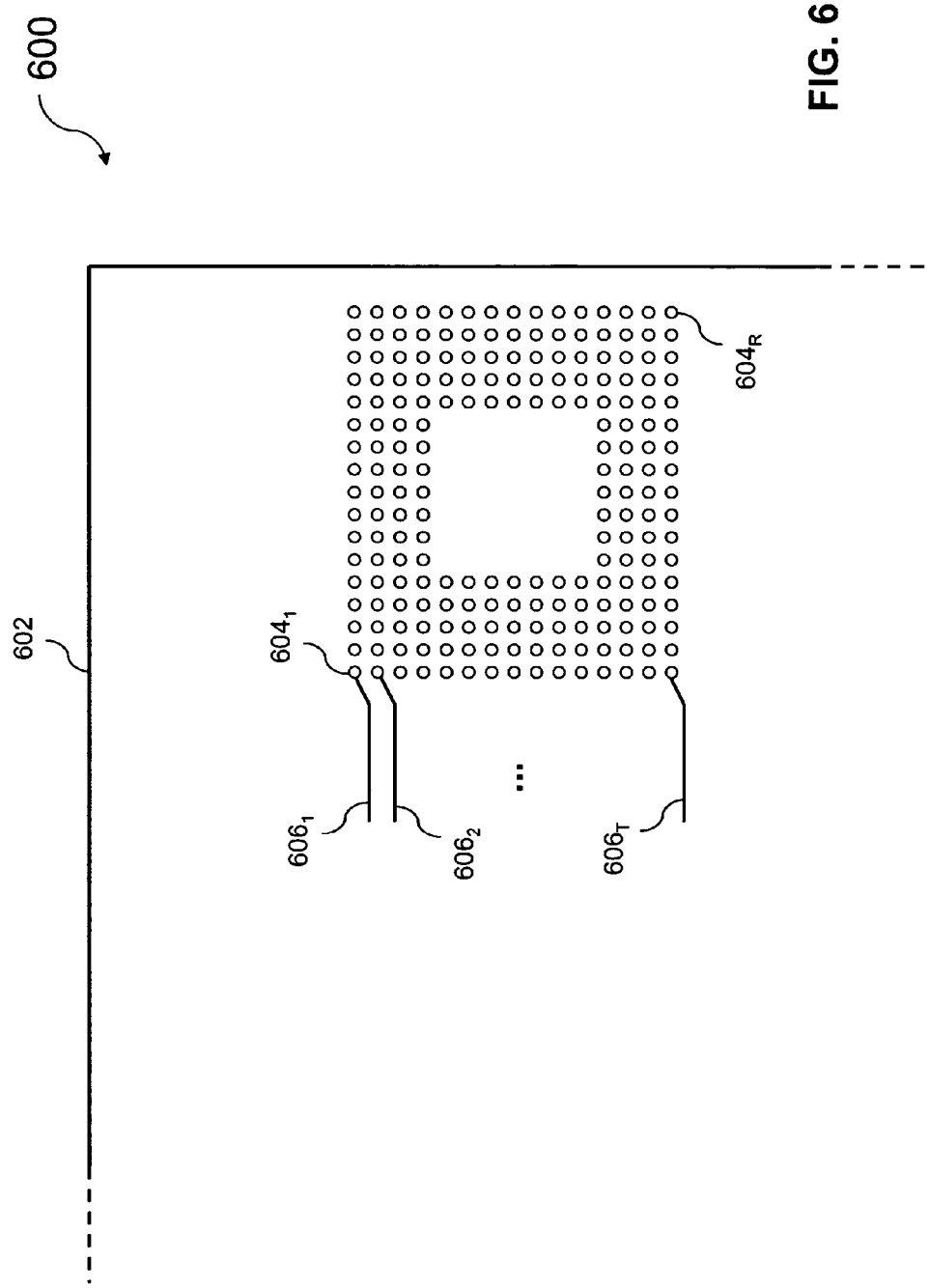

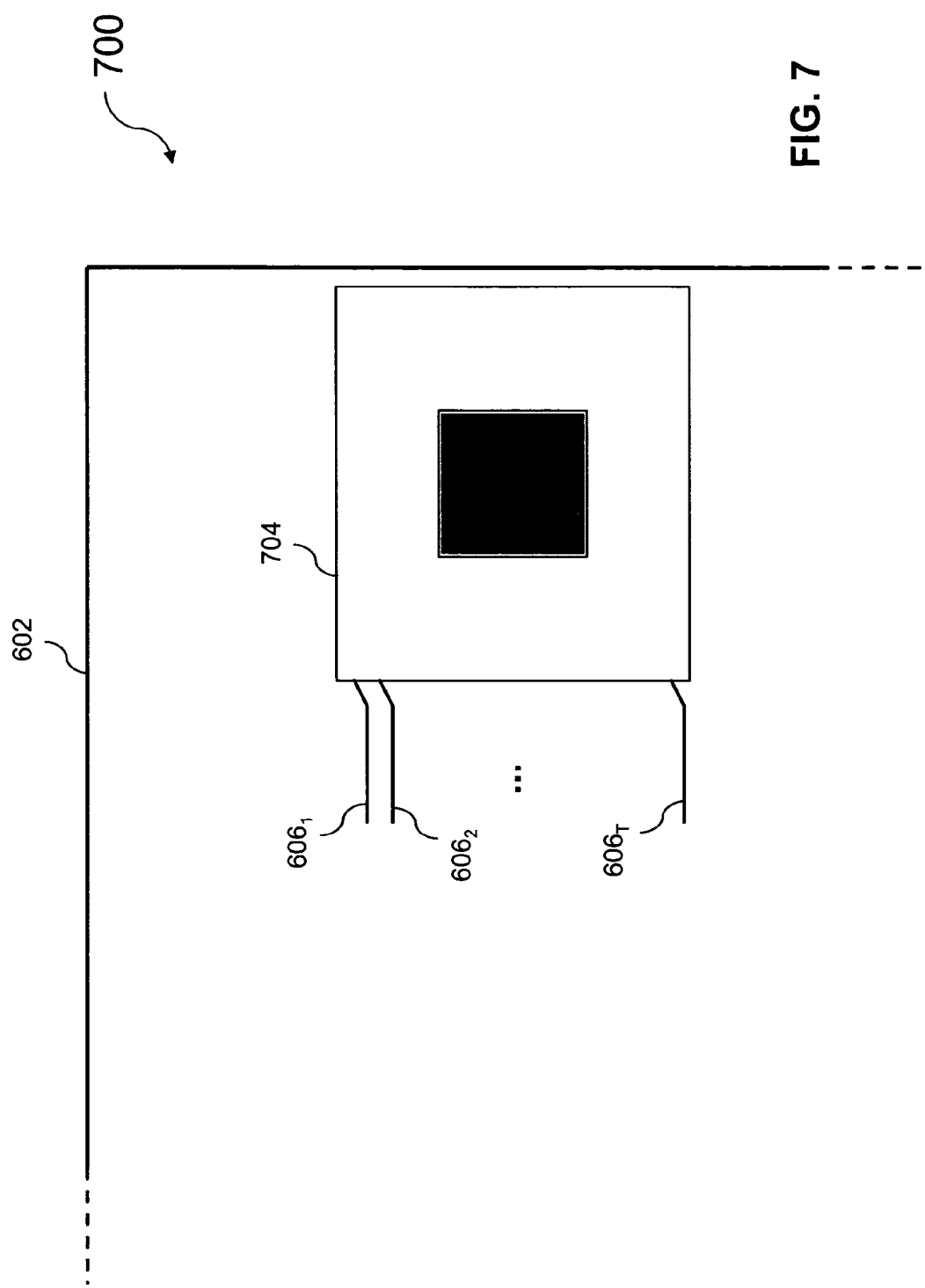

COLUMN GRID ARRAY USING COMPLIANT CORE

BACKGROUND

The demand for increased functionality in both consumer and industrial electronics, coupled with the trend of miniaturization, continues to place complexity and size constraints on the packaging of electronic components, specifically the number of pins available on an electronic component, e.g., an integrated circuit (IC), passive device, or semiconductor. A preferred solution has been the development of the column grid array, or CGA, which provides a type of surface-mount packaging used to conduct electrical signals from the electronic component to the printed wiring board (PWB) the electronic component is placed on. Instead of using traditional pins to connect the component to the PWB, columns of solder are affixed to the bottom of the component substrate and attached to the PWB, creating an array of columns.

A primary disadvantage of CGAs, however, is that the solder columns fatigue more rapidly than the traditional lead to pin connections do. Repeated periods of high thermal or mechanical stress followed by periods of relaxations in the interconnect area(s) eventually cause the solder joints to fracture. The fracture of a single solder joint, i.e., a single column, produces an open circuit or partial failure. Therefore, the CGA is not always a popular choice in certain fields, especially high reliability applications, which require an interconnection between the component and the PWB to be highly flexible during repeated intervals of thermal cycling. In particular, high reliability applications entail a more detailed material selection based on other properties, including exposure to extreme environments.

To overcome the effects of exposure to extreme environments in high reliability applications, the component is typically constructed of a ceramic substrate. However, use of the ceramic substrate material comes at an economic cost, particularly with an increased coefficient of thermal expansion (CTE) difference between the component and the PWB. The higher CTE value means that the interconnections between the component and PWB are subject to a higher amount of fatigue. The increased fatigue decreases the overall life of the packaged assembly. Therefore, current electronic assemblies using components with ceramic substrates are constrained to a limited capacity in an effort to reduce the effects of the difference in CTE values between the component and the PWB.

For the reasons stated above and for other reasons stated below which will become apparent to those skilled in the art upon reading and understanding the specification, there is a need in the art for improved interconnections within a column grid array.

SUMMARY

The above mentioned problems with interconnections within a column grid array and other problems are addressed by embodiments of the present invention and will be understood by reading and studying the following specification. Particularly, in one embodiment, a method for forming interconnections within a column grid array is provided. The method involves casting one or more columns with at least a compliant core material that increases flexibility between an electronic component and a printed wiring board by at least a factor of two over metallic-based solder columns, and forming the one or more columns to length for interconnecting between the electronic component and the printed wiring board. The method also involves forming a conductive material for the one or more columns to provide electrical interconnection between the electronic component and the printed wiring board.

DRAWINGS

Figure 5:
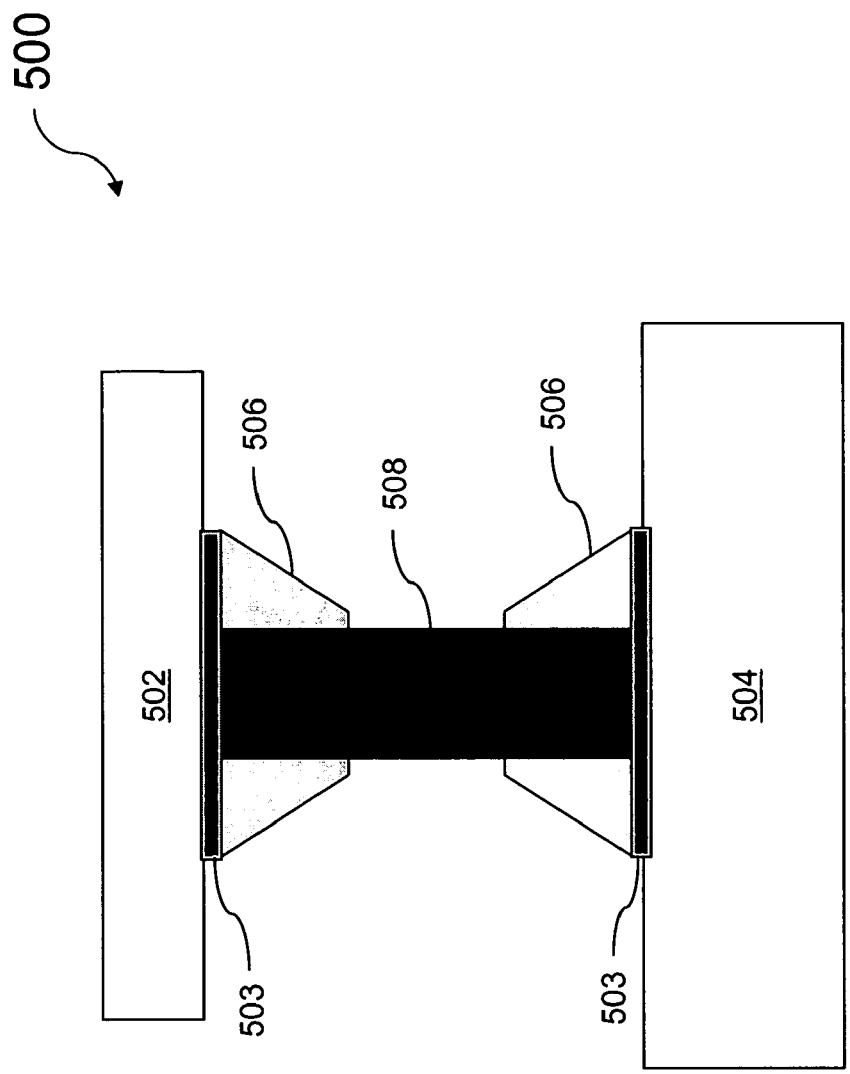

FIG. 5 is an elevational view in cross-section of still another embodiment of an electronic assembly with column grid arrays using compliant core material in accordance with the present invention; and FIGS. 6 and 7 are a series of views that illustrate an embodiment of a method for manufacturing an electronic assembly with column grid arrays using compliant core material in accordance with the present invention.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention address problems with forming interconnections within a column grid array and will be understood by reading and studying the following specification. Particularly, in one embodiment, a method for forming interconnections within a column grid array is provided. The method involves casting one or more columns with at least a compliant core material that increases flexibility between an electronic component and a printed wiring board by at least a factor of two over metallic-based solder columns, and forming the one or more columns to length for interconnecting between the electronic component and the printed wiring board. The method also involves forming a conductive material for the one or more columns to provide electrical interconnection between the electronic component and the printed wiring board.

Although the examples of embodiments in this specification are described in terms of component interconnections for high reliability electronics, embodiments of the present invention are not limited to applications of component interconnections for high reliability electronics. Embodiments of the present invention are applicable to any electronic assembly activity that requires the use of column grid arrays. Alternate embodiments of the present invention to those described below use a compliant core material to cast grid array columns that have increased flexibility and durability, and increase the capacity of component interconnections on an electronic assembly.

Figure 1:
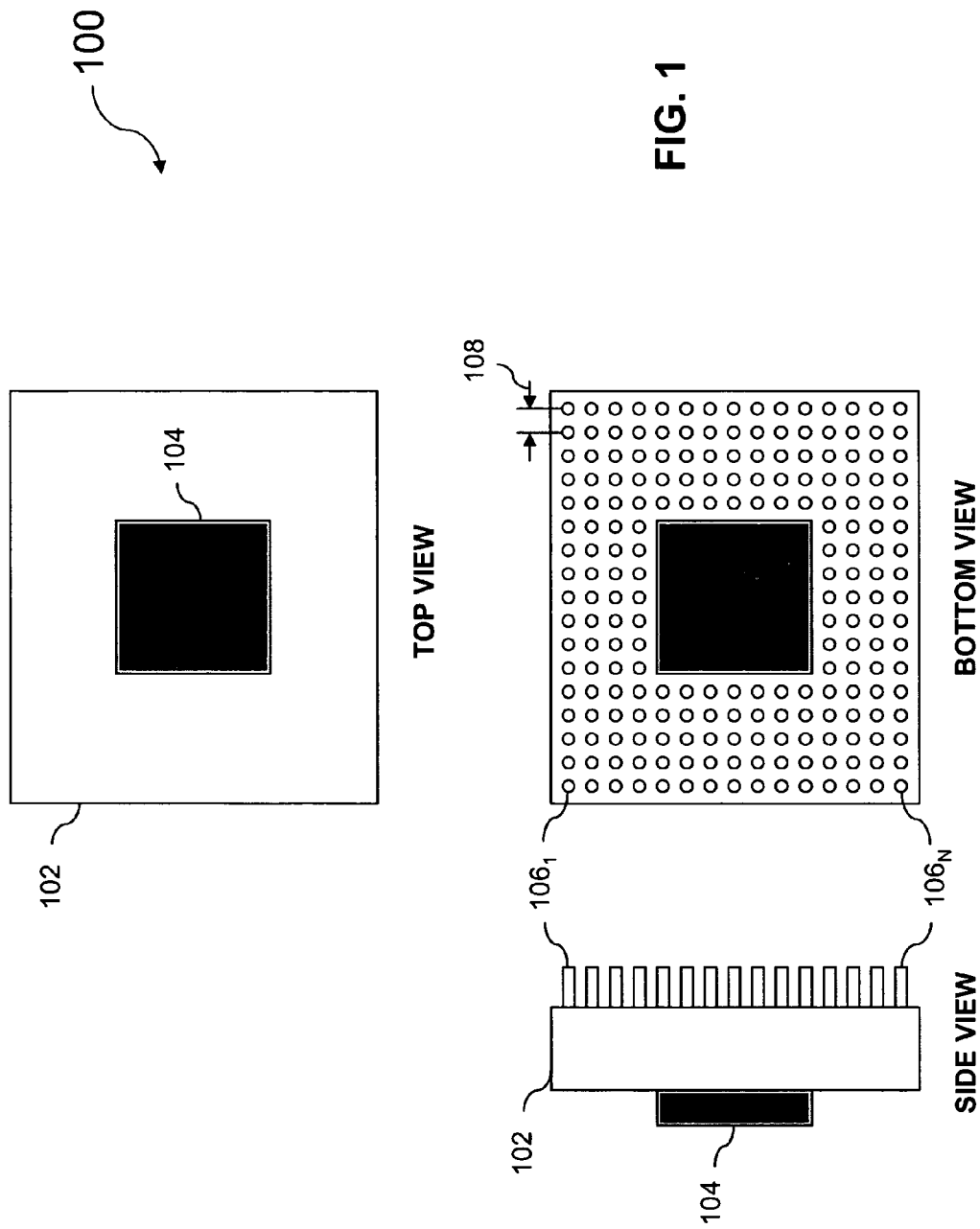
FIG. 1 is a top, bottom and side view of an embodiment of an electronic package with a column grid array interconnection arrangement in accordance with the present invention.

Referring to the drawings, FIG. 1 is a top, bottom and side view of an embodiment of an electronic package, indicated generally at 100, with a column grid array (CGA) interconnection arrangement according to the teachings of the present invention. In one embodiment, package 100 is an electronic component such as an integrated circuit (IC), passive device, semiconductor, or the like. Package 100 includes package substrate 102 and package lid 104, as shown in the top view. It is to be understood that package lid 104 is an optional accessory, and is not required for every embodiment of package 100. In one embodiment, package substrate 102 and package lid 104 are constructed of a ceramic material used to overcome exposure to extremely harsh environments. The bottom and side views of package 100 illustrate component interconnections $106_1$ to $106_N$. In one embodiment, component interconnections $106_1$ to $106_N$ form an array of columns, commonly referred to as a CGA. Moreover, component interconnections $106_1$ to $106_N$ are constructed for connection to a corresponding printed wiring board, or PWB (not shown). It is understood that the arrangement of component interconnections $106_1$ to $106_N$ as shown in FIG. 1 is one example of an acceptable arrangement, and that other arrangements are possible.

In one embodiment, component interconnections $106_1$ to $106_N$ are cast of at least a compliant core material having a modulus of elasticity below 10 gigapascals (GPa). Component interconnections $106_1$ to $106_N$ are formed to the proper length for interconnecting electronic package 100 with the corresponding PWB. Exemplary embodiments of this compliant core material are further described with respect to FIGS. 2 to 5 below. Other materials and constructions that have a modulus of elasticity similar to that of the component interconnections $106_1$ to $106_N$ are also within the teachings of the present application. Component interconnections $106_1$ to $106_N$ are attached to circuit 100 using metallic plating such as further described, for example, with respect to FIGS. 2 to 5 below. Additionally, a conductive material is affixed to component interconnections $106_1$ to $106_N$ for the passage of electrical signals between electronic package 100 and the corresponding PWB. Examples of affixing a conductive material are also described with respect to FIGS. 2 to 5 below.

The compliant core material used in the construction of component interconnections $106_1$ to $106_N$ provides additional flexibility over conventional CGA solder columns. In some embodiments, the flexibility of the column grid arrays of the present application improves by at least a factor of two over metallic-based solder column grid arrays. The added flexibility of the component interconnections increases reliability, and allows for additional component interconnections to be accommodated within an existing footprint of an electronic package. In one embodiment, the arrangement of the component interconnections $106_1$ to $106_N$ provides a spacing 108 as close as 0.1 mm between adjacent ones of each of the component interconnections $106_1$ to $106_N$. Moreover, spacing 108 allows for at least 1144 component interconnections $106_1$ to $106_N$ between electronic package 100 and the corresponding PWB.

Figure 2:
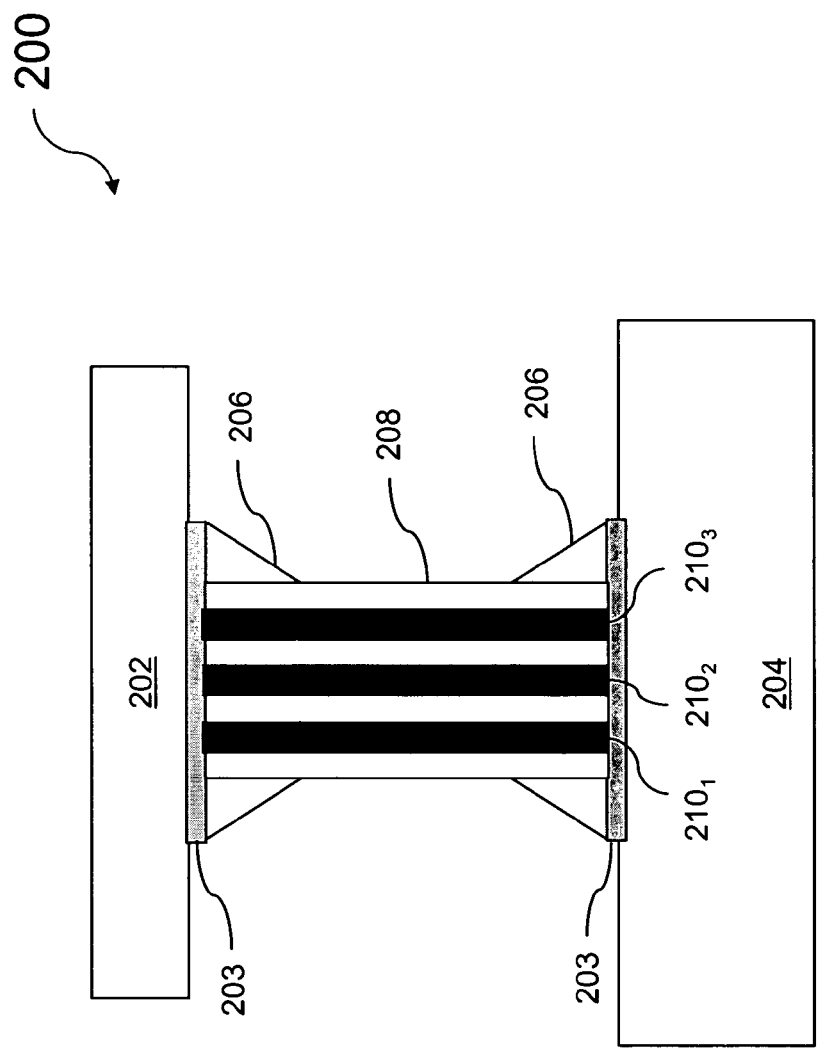
FIG. 2 is an elevational view in cross-section of an embodiment of an electronic assembly with column grid arrays using compliant core material in accordance with the present invention.

FIG. 2 is an elevational view in cross section of an embodiment of an electronic assembly, indicated generally at 200, with column grid arrays using compliant core materials according to the teachings of the present invention. Assembly 200 comprises electronic package 202 and PWB 204 interconnected by at least one column 208. It is noted that for simplicity in description, one column 208 is shown in FIG. 2. However, it is understood that assembly 200 supports any appropriate number of columns, e.g., at least one or more columns in a single assembly. Column 208 is physically attached to both electronic package 202 and PWB 204 by a minimum of two eutectic, i.e., of maximum fusibility, solder fillets 206. Column 208 is cast with copper conductors $210_1$ to $210_3$, e.g., copper threading or wiring, within the structure of column 208 to provide an electrical connection between electronic package 202 and PWB 204. It is noted that in this description, a total of three copper conductors $210_1$ to $210_3$ are shown in FIG. 2. However, it is understood that column 208 supports any appropriate number of copper conductors, e.g., one or more conductors in a single column.

In one embodiment, column 208 is comprised of a plastic material with a low modulus of elasticity (E). The plastic material has a coefficient of thermal expansion (CTE) value below 50 parts per million per degree Celsius (ppm/° C.). The term CTE is used to express the expansion and contraction of material as a fractional change in volume of the material per degree of temperature change. In another embodiment, column 208 is comprised of a composite metal with a low E value and a CTE value below 50 ppm/° C. In yet another embodiment, column 208 is comprised of a flexible metal with a low E value and a CTE value below 50 ppm/° C. In still another embodiment, column 208 is comprised of any suitable material with a low E value and a CTE value below 50 ppm/° C.

Prior to assembly, column 208 is cut to an appropriate size and etched on edges to expose copper conductors $210_1$ to $210_3$. In one embodiment, column 208 is plated at either end with a metallic material 203, e.g. a combination of nickel and gold, to ensure eutectic solder fillet 206 attaches to column 208 and copper conductors $210_1$ to $210_3$. In another embodiment, column 208 is completely plated with metallic material 203. During assembly, eutectic solder fillet 206 wicks up the side of both ends of column 208 (now plated) and copper conductors $210_1$ to $210_3$ are secured within the solder material of eutectic solder fillet 206 when attached to package 202 and PWB 204. The low E value of column 208 allows greater flexibility and stress relaxation between electronic package 202 and PWB 204 than metallic-based solder columns, e.g., below 10 GPa for column 208 vs. 20-30 GPa for solder columns comprised of a tin/lead combination. Limiting the CTE value of column 208 provides increased product durability during repeated periods of extreme operating temperatures. More specifically, the same bending and thermal expansion that occurs in PWB 204 occurs in column 208. This translates to less stress and strain on assembly 200. Knowledge of increased durability provides a potential for designers to increase the capacity, e.g. number of signal pins, on electronic package 202.

Figure 3:
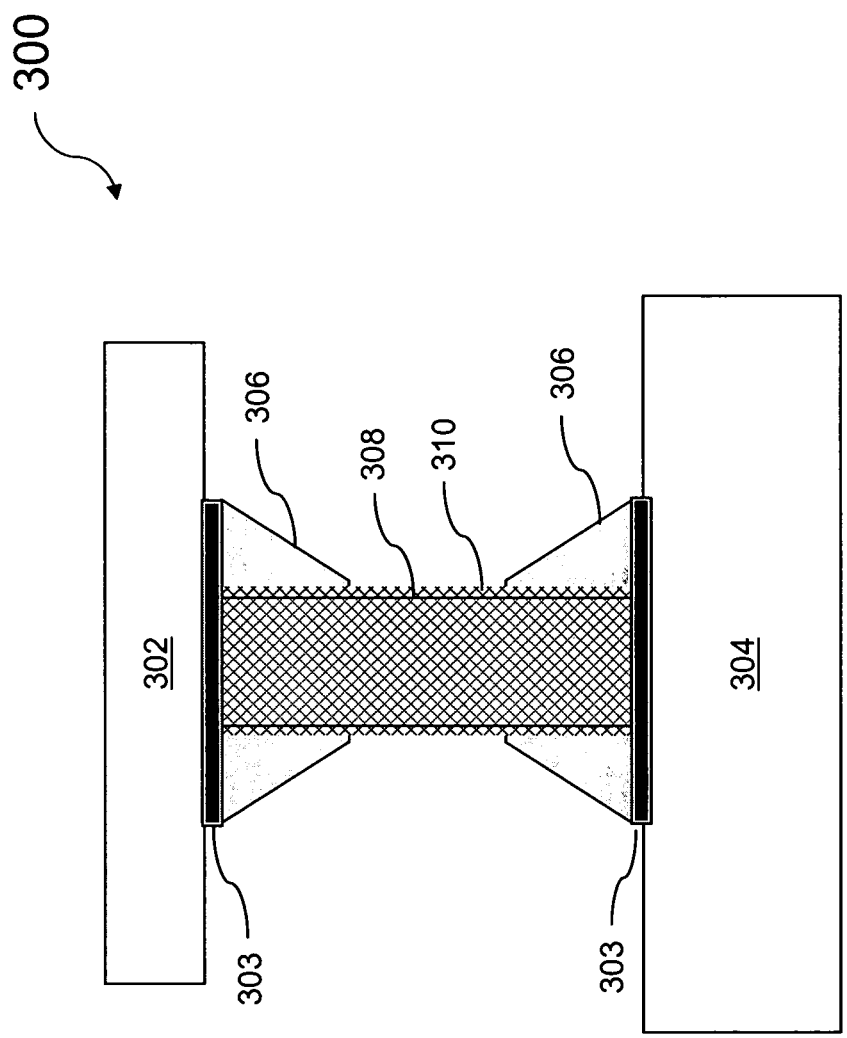
FIG. 3 is an elevational view in cross-section of another embodiment of an electronic assembly with column grid arrays using compliant core material in accordance with the present invention.

FIG. 3 is an elevational view in cross section of another embodiment of an electronic assembly, indicated generally at 300, with column grid arrays using compliant core materials according to the teachings of the present invention. Assembly 300 comprises electronic package 302 and PWB 304 interconnected by at least one column 308. It is noted that for simplicity in description, one column 308 is shown in FIG. 3. However, it is understood that assembly 300 supports any appropriate number of columns, e.g., at least one or more columns in a single assembly. Column 308 is physically attached to both electronic package 302 and PWB 304 by a minimum of two eutectic solder fillets 306. A metallic mesh 310 is bonded to and surrounds column 308 for both thermal and electrical conductivity.

In one embodiment, column 308 is comprised of a plastic material with a low E value. The plastic material has a CTE value below 50 ppm/° C. In another embodiment, column 308 is comprised of a composite metal with a low E value and a CTE value below 50 ppm/° C. In yet another embodiment, column 308 is comprised of a flexible metal with a low E value and a CTE value below 50 ppm/° C. In still another embodiment, column 308 is comprised of any suitable material with a low E value and a CTE value below 50 ppm/° C.

Prior to assembly, in one embodiment, column 308 is cast appropriately and cut to a specified column length. In another embodiment, column 308 is extruded appropriately and cut to a specified column length. Column 308 is then plated at either end with a metallic material 303, e.g. a combination of nickel and gold, to ensure eutectic solder fillet 306 attaches to column 308. In another embodiment, column 308 is completely plated with metallic material 303. During assembly, metallic mesh 310 is slipped over and bonded to column 308 (now plated). In one embodiment, metallic mesh 310 is trimmed prior to becoming fitted to column 308. In another embodiment, metallic mesh 310 is trimmed after it is fitted to column 308. Once metallic mesh 310 is bonded to column 308, column 308 is secured with the solder material of eutectic solder fillet 306 when attached to electronic package 302 and PWB 304.

The low E value of column 308 allows greater flexibility and stress relaxation between electronic package 302 and PWB 304 than metallic-based solder columns, e.g., below 10 GPa for column 208 vs. 20-30 GPa for solder columns comprised of a tin/lead combination. Limiting the CTE value of column 308 provides increased product durability during repeated periods of extreme operating temperatures. The material used for metallic mesh 310 is also selected to have a low E value, allowing for additional thermal expansion and contraction. Additionally, since metallic mesh 310 consists of multiple webs, the reliability of the electrical conductivity increases. This increase is due to the fact that no single point of failure can occur, i.e., be attributed to, a possible loss of conductivity. Furthermore, if column 308 were to experience a fracture, metallic mesh 310 maintains conductivity and keeps assembly 300 functioning.

Figure 4:
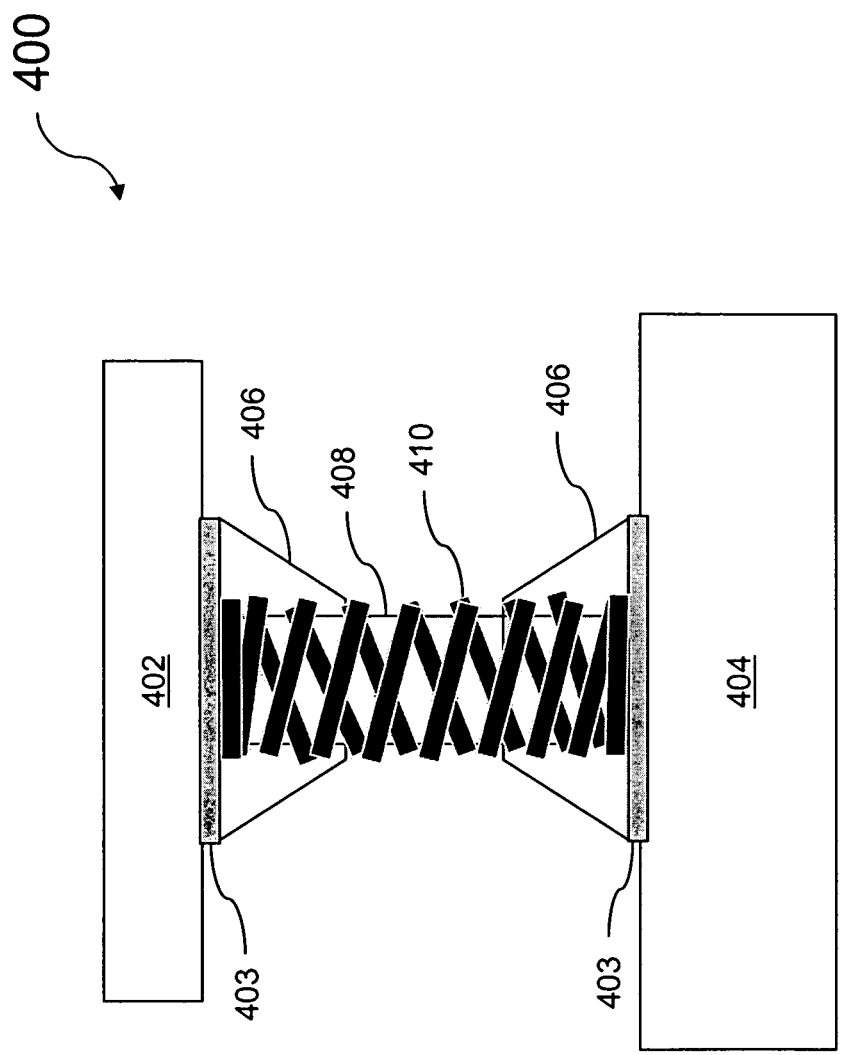
FIG. 4 is an elevational view in cross-section of yet another embodiment of an electronic assembly with column grid arrays using compliant core material in accordance with the present invention.

FIG. 4 is an elevational view in cross section of yet another embodiment of an electronic assembly, indicated generally at 400, with column grid arrays using compliant core materials according to the teachings of the present invention. Assembly 400 comprises electronic package 402 and PWB 404 interconnected by at least one column 408. It is noted that for simplicity in description, one column 408 is shown in FIG. 4. However, it is understood that assembly 400 supports any appropriate number of columns, e.g., at least one or more columns in a single assembly. Column 408 is physically attached to both electronic package 402 and PWB 404 by a minimum of two eutectic solder fillets 406. A plurality of metallic coils 410 are intertwined and extended the length of column 408 for both thermal and electrical conductivity.

In one embodiment, column 408 is comprised of a plastic material with a low E value. The plastic material has a CTE value below 50 ppm/° C. In another embodiment, column 308 is comprised of a composite metal with a low E value and a CTE value below 50 ppm/° C. In yet another embodiment, column 308 is comprised of a flexible metal with a low E value and a CTE value below 50 ppm/° C. In still another embodiment, column 308 is comprised of any suitable material with a low E value and a CTE value below 50 ppm/° C.

Prior to assembly, column 408 is cast appropriately and cut to a suitable length for pre-assembly purposes. Column 408 is then plated on either end with a metallic material 403, e.g. a combination of nickel and gold, to ensure eutectic solder fillet 406 attaches to column 408. In another embodiment, column 408 is completely plated with metallic material 403. During assembly, the plurality of metallic coils 410 are intertwined and extended the length of column 408 (now plated). Once the plurality of metallic coils 410 is extended the length of column 408, column 408 is cut to a specified column length. In one embodiment, the ends of column 408 are plated with the same metallic material that ensures attachment to electronic package 402 and PWB 404 with the solder material of eutectic solder fillet 406. In another embodiment, the ends of column 408 are dipped in the same metallic material that ensures attachment to electronic package 402 and PWB 404 with the solder material of eutectic solder fillet 406.

The low E value of column 408 allows greater flexibility and stress relaxation between electronic package 402 and PWB 404 than metallic-based solder columns, e.g., below 10 GPa for column 208 vs. 20-30 GPa for solder columns comprised of a tin/lead combination. Limiting the CTE value of column 208 provides increased product durability during repeated periods of extreme operating temperatures. The material used for the plurality of metallic coils 410 is also selected to have a low E value, allowing for additional thermal expansion and contraction. Additionally, since the plurality of metallic coils 410 consists of multiple coils, the reliability of the electrical conductivity increases. This increase is due to the fact that no single point failure can occur, i.e., be attributed to, a possible loss of conductivity. When column 408 undergoes a thermal expansion, the plurality of metallic coils 410 are not damaged and maintain conductivity. This ability to maintain conductivity keeps assembly 400 functioning. Furthermore, the plurality of metallic coils 410 provides a comparatively stronger interconnect than the assembly of FIG. 3. This ensures optimal performance under conditions of intense vibration.

FIG. 5 is an elevational view in cross section of still another embodiment of an electronic assembly, indicated generally at 500, with column grid arrays using compliant core materials according to the teachings of the present invention. Assembly 500 comprises electronic package 502 and PWB 504 interconnected by at least one column 508. It is noted that for simplicity in description, one column 508 is shown in FIG. 5. However, it is understood that assembly 500 supports any appropriate number of columns, e.g., at least one or more columns in a single assembly. Column 508 is physically attached to both electronic package 502 and PWB 504 by a minimum of two eutectic solder fillets 506. In one embodiment, column 508 is comprised of a conductive epoxy material with a low E value. The conductive epoxy material has a CTE value below 50 ppm/° C. Moreover, the structure of column 508 provides an electrical connection between electronic package 502 and PWB 504.

Prior to assembly, column 508 is cut to an appropriate size and plated on either end with a metallic material 503, e.g., a combination of nickel and gold, to ensure eutectic solder fillet 506 attaches to column 508. In another embodiment, column 508 is completely plated with metallic material 503. During assembly, eutectic solder fillet 506 wicks up the side of both ends of column 508 (now plated) and column 508 is secured within the solder material of eutectic solder fillet 506 when attached to electronic package 502 and PWB 504. The low E value of column 508 allows greater flexibility and stress relaxation between electronic package 502 and PWB 504 than metallic-based solder columns, e.g., below 10 GPa for column 508 vs. 20-30 GPa for solder columns comprised of a tin/lead combination. Limiting the CTE value of column 508 provides increased product durability during repeated periods of extreme operating temperatures. More specifically, the same bending and thermal expansion that occurs in PWB 504 occurs in column 508. This translates to less stress and strain on assembly 500. Knowledge of increased durability provides a potential for designers to increase the capacity, e.g. number of signal pins, on electronic package 502.

FIGS. 6 and 7 illustrate an embodiment of a method for manufacturing an electronic assembly with column grid arrays using compliant core material according to the teachings of the present invention. This method is illustrated herein by way of example and not by way of limitation. Other manufacturing methods, existing or later developed, can be used to interconnect electronic components using compliant core material. An advantage of interconnecting electronic components using compliant core material as shown in the illustrative embodiments of this application is that the CTE value of the compliant core material is sufficiently limited. This limit is enough to increase the flexibility of the column grid arrays of the present application under extreme operating conditions, e.g., continual temperature cycling and/or sustained vibration, by at least a factor of two over metallic-based solder column grid arrays.

Referring to FIG. 6, the method begins with an unpopulated PWB 602. It is noted that for simplicity in description, only a portion of unpopulated PWB 602 is shown in FIG. 6. Unpopulated PWB 602 includes electronic package connectors $604_1$ to $604_R$ and electronic trace elements $606_1$ to $606_T$. In one embodiment, each of electronic trace elements $606_1$ to $606_T$ corresponds to a respective one of electronic package connectors $604_1$ to $604_R$, e.g., electronic trace element $606_1$ carries the electrical signal either up to or away from electronic package connector $604_1$. Moreover, each of electronic package connectors $604_1$ to $604_R$ is designed to accommodate electronic component interconnection packaging in a column grid array pattern. The electronic component interconnection packaging is constructed, for example, in any of the methods described with respect to FIGS. 2 to 5 above. As shown in FIG. 7, an electronic package 704 is positioned relative to the set of electronic package connectors $604_1$ to $604_R$ previously discussed in FIG. 6. Electronic package 704 is coupled to PWB 602 using, for example, any of the CGA packaging embodiments described with respect to FIGS. 2 to 5 above.

In view of the foregoing, it will be understood by those skilled in the art that the methods of the present invention can be implemented in combination with present electronic assembly manufacturing technology. Variations and modifications may occur, which fall within the scope of the present invention, as set forth in the following claims.

What is claimed is:

1. A method for forming interconnections within a column grid array, the method comprising:
   casting one or more columns with at least a non-conducting compliant core material that increases flexibility between an electronic component and a printed wiring board by at least a factor of two over metallic-based solder columns;
   forming the one or more columns to length for interconnecting between the electronic component and the printed wiring board; and
   forming a conductive material for the one or more columns to provide electrical interconnection between the electronic component and the printed wiring board, wherein the conductive material is the only electrical connection between the electronic component and the printed wiring board, the conductive material comprising one of a group of:
   at least one copper conductor cast internally within each of the one or more columns,
   a metallic mesh bonded to and surrounding each of the one or more columns, and
   a plurality of metallic coils intertwined and extending the length of each of the one or more columns.

2. The method of claim 1, wherein the compliant core material has a modulus of elasticity below 10 GPa.

3. The method of claim 1, wherein the compliant core material is one of a plastic, a composite material, a flexible metal or other suitable material with a coefficient of thermal expansion below 50 ppm/° C.

4. The method of claim 1, further comprising plating the one or more columns with a metallic material to enable attachment between the electronic component and the printed wiring board.

5. The method of claim 4, wherein the metallic material is a combination of nickel and gold.

6. The method of claim 1, further comprising spacing the interconnections as close as 0.1 mm.

7. The method of claim 1, wherein the conductive material comprises at least one copper conductor cast internally within each of the one or more columns.

8. The method of claim 1, wherein the conductive material comprises a metallic mesh bonded to an surrounding each of the one or more columns.

9. The method of claim 1, wherein the conductive material comprises a plurality of metallic coils intertwined and extending the length of each of the one or more columns.

10. An electronic assembly, comprising:
    one or more electronic components;
    at least one printed wiring board including a set of traces for coupling to the one or more electronic components using one or more column grid arrays; and
    one or more interconnect packages for the one or more column grid arrays, the one or more packages comprising:
    a plurality of columns formed to length and cast of at least a non-conducting compliant core material that improves elasticity of the plurality of columns by at least a factor of two over metallic-based solder columns;
    a metallic plating to allow for attachment between the at least one electronic component and the at least one printed wiring board; and
    wherein the plurality of columns each include a conductive material that couples between the one or more electronic components and the at least one printed wiring board, wherein the conductive material is the only electrical connection between the electronic component and the printed wiring board, the conductive material comprising one of a group of:
    at least one copper conductor cast internally within each of the plurality of columns,
    a metallic mesh bonded to and surrounding each of the plurality of columns, and
    a plurality of metallic coils intertwined and extending the length of each of the plurality of columns.

11. The assembly of claim 10, wherein the conductive material comprises a metallic mesh bonded to an surrounding each of the one or more columns.

12. The assembly of claim 10, wherein the conductive material comprises a plurality of metallic coils intertwined and extending the length of each of the one or more columns.

13. The assembly of claim 10, wherein the conductive material comprises at least one copper conductor cast internally within each of the one or more columns.

14. The assembly of claim 10, wherein the compliant core material has a modulus of elasticity below 10 GPa.

15. The assembly of claim 10, wherein the compliant core material is one of a plastic, a composite material, a flexible metal or other suitable material with a coefficient of thermal expansion below 50 ppm/° C.

16. The assembly of claim 10, wherein the metallic plating to allow for attachment between an integrated circuit and an electronic assembly is a combination of nickel and gold.

17. The assembly of claim 10, wherein spacing between adjacent ones of the plurality of columns is as close as 0.1 mm.

18. An electronic assembly, comprising:
one or more electronic components;
at least one printed wiring board including a set of traces for coupling to the one or more electronic components using one or more column grid arrays; and
one or more interconnect packages for the one or more column grid arrays, the one or more packages comprising:
a plurality of columns formed to length and cast of at least a non-conducting compliant core material that improves elasticity of the plurality of columns by at least a factor of two over metallic-based solder columns, wherein the plurality of columns each include a conductive material comprising at least one copper conductor cast internally within each of the plurality of columns, and
wherein the conductive material couples between the one or more electronic components and the at least one printed wiring board; and
a metallic plating to allow for attachment between the at least one electronic component and the at least one printed wiring board.

19. An electronic assembly, comprising:
one or more electronic components;
at least one printed wiring board including a set of traces for coupling to the one or more electronic components using one or more column grid arrays; and
one or more interconnect packages for the one or more column grid arrays, the one or more packages comprising:
a plurality of columns formed to length and cast of at least a compliant core material that improves elasticity of the plurality of columns by at least a factor of two over metallic-based solder columns, wherein the plurality of columns each include a conductive material comprising a metallic mesh bonded to and surrounding each of the plurality of columns, and
wherein the conductive material couples between the one or more electronic components and the at least one printed wiring board; and
a metallic plating to allow for attachment between the at least one electronic component and the at least one printed wiring board.

\* \* \* \* \*